United States Patent
Babin et al.

(10) Patent No.: US 10,678,967 B2
(45) Date of Patent: Jun. 9, 2020

(54) ADAPTIVE RESOURCE RESERVOIR DEVELOPMENT

(71) Applicants: International Business Machines Corporation, Armonk, NY (US); Gazpromneft NTC LLC, Saint-Petersburg (RU)

(72) Inventors: Vladimir M. Babin, Saint-Petersburg (RU); David Echeverria Ciaurri, New York, NY (US); Bruno Da Costa Flach, Rio de Janeiro (BR); Arseniy Gruzdev, Moscow (RU); Miguel Paredes Quinones, São Paulo (BR); Alexander Pozdneev, Moscow (RU); Artyom Semenikhin, Moscow (RU); Oleg S. Ushmaev, Saint-Petersburg (RU); Andrey M. Vashevnik, Saint-Petersburg (RU)

(73) Assignees: International Business Machines Corporation, Armonk, NY (US); GAZPROMNEFT SCIENCE & TECHNOLOGY CENTRE LLC, Saint-Petersburg (RU)

( * ) Notice: Subject to any disclaimer, the term of this patent is extended or adjusted under 35 U.S.C. 154(b) by 824 days.

(21) Appl. No.: 15/331,207

(22) Filed: Oct. 21, 2016

(65) Prior Publication Data
US 2018/0113962 A1 Apr. 26, 2018

(51) Int. Cl.
*G06F 30/20* (2020.01)
*G01V 11/00* (2006.01)

(52) U.S. Cl.
CPC .............. *G06F 30/20* (2020.01); *G01V 11/00* (2013.01)

(58) Field of Classification Search
CPC .. G06F 17/5009; G06F 2119/22; G06F 30/20; G06F 30/25; G06F 30/27; G06F 30/28; G06F 2111/00; G01V 11/00
(Continued)

(56) References Cited

U.S. PATENT DOCUMENTS 4,249,776 A * 2/1981 Shuck ................ E21B 43/30
166/245
6,549,879 B1 * 4/2003 Cullick ................ E21B 49/00
703/10
(Continued)

OTHER PUBLICATIONS

Huntley et al. (Normal Form Backward Induction for decision Tress with coherent lower provisions, Annals of Operations Research, 195(1):111-134, 2012). (Year: 2012).*
(Continued)

*Primary Examiner* — Iftekhar A Khan
(74) *Attorney, Agent, or Firm* — Kristofer Haggerty; Otterstedt, Wallace & Kammer, LLP

(57) ABSTRACT

A plurality of development scenarios is determined. At least a first well is drilled at a first location and trajectory that are common to the plurality of development scenarios. A result of the at least one first well is assessed. A first subset of development scenarios is selected from the plurality of development scenarios based at least on the result of the first well. A first sequence of subsequent wells, including at least one well, are drilled at a first sequence of subsequent locations and trajectories that are common to the first subset of development scenarios.

19 Claims, 11 Drawing Sheets

(58) Field of Classification Search
USPC ............................................................ 703/10
See application file for complete search history.

(56) References Cited

U.S. PATENT DOCUMENTS

| | | | | |
|---|---|---|---|---|
| 6,912,467 | B2* | 6/2005 | Schuette | G01V 11/00 367/43 |
| 7,031,840 | B1* | 4/2006 | Brett | E21B 44/00 702/9 |
| 7,254,091 | B1* | 8/2007 | Gunning | G01V 11/00 367/73 |
| 7,433,851 | B2* | 10/2008 | Mirowski | G01V 1/30 367/25 |
| 9,002,766 | B2* | 4/2015 | Trainor-Guitton | E21B 41/0092 706/45 |
| 9,058,446 | B2* | 6/2015 | Lu | G01V 11/00 |
| 9,593,558 | B2* | 3/2017 | Sequeira, Jr. | E21B 7/04 |
| 9,864,098 | B2* | 1/2018 | Sequeira, Jr. | G01V 99/005 |
| 10,262,280 | B2* | 4/2019 | Zhao | E21B 41/00 |
| 10,318,663 | B2* | 6/2019 | Cheng | G06T 11/206 |
| 10,332,219 | B2* | 6/2019 | Colvin | G06Q 10/06 |
| 10,386,531 | B2* | 8/2019 | Biterge | G01V 1/301 |
| 2003/0220906 | A1* | 11/2003 | Chickering | G06N 7/005 |
| 2004/0011524 | A1* | 1/2004 | Raghuraman | E21B 47/00 166/252.4 |
| 2005/0149307 | A1* | 7/2005 | Gurpinar | E21B 43/00 703/10 |
| 2005/0216496 | A1* | 9/2005 | Chickering | G06N 7/005 |
| 2006/0151214 | A1* | 7/2006 | Prange | E21B 7/04 175/45 |
| 2007/0011113 | A1* | 1/2007 | Mosleh | G06N 7/005 706/14 |
| 2007/0016389 | A1* | 1/2007 | Ozgen | E21B 47/00 703/10 |
| 2007/0156377 | A1* | 7/2007 | Gurpinar | E21B 43/00 703/10 |
| 2007/0226158 | A1* | 9/2007 | Woronow | G01V 11/00 706/17 |
| 2008/0077371 | A1* | 3/2008 | Yeten | E21B 43/00 703/10 |
| 2008/0300793 | A1* | 12/2008 | Tilke | E21B 43/30 702/13 |
| 2009/0125288 | A1* | 5/2009 | Main | E21B 49/00 703/10 |
| 2009/0164186 | A1* | 6/2009 | Haase | G01V 99/00 703/10 |
| 2010/0108322 | A1* | 5/2010 | Eilertsen | E21B 7/12 166/352 |
| 2010/0185422 | A1* | 7/2010 | Hoversten | G01V 11/00 703/2 |
| 2010/0325075 | A1* | 12/2010 | Goel | G01V 99/00 706/46 |
| 2011/0072206 | A1* | 3/2011 | Ross | H04L 67/1097 711/108 |
| 2011/0172976 | A1* | 7/2011 | Budiman | E21B 47/022 703/2 |
| 2011/0172977 | A1* | 7/2011 | Kolbjornsen | G01V 11/00 703/2 |
| 2011/0307230 | A1* | 12/2011 | Lee | G01V 99/00 703/10 |
| 2012/0084007 | A1* | 4/2012 | Tran | G01V 11/00 702/6 |
| 2012/0158389 | A1* | 6/2012 | Wu | G16C 20/30 703/10 |
| 2012/0215511 | A1* | 8/2012 | Sarma | G01V 99/005 703/10 |
| 2012/0317060 | A1* | 12/2012 | Jebara | G06N 20/00 706/21 |
| 2013/0246032 | A1* | 9/2013 | El-Bakry | E21B 41/00 703/10 |
| 2013/0317798 | A1* | 11/2013 | Cheng | E21B 43/305 703/10 |
| 2014/0067744 | A1* | 3/2014 | Trainor-Guitton | E21B 41/0092 706/46 |
| 2014/0136111 | A1* | 5/2014 | Rossi | E21B 43/00 702/6 |
| 2014/0365183 | A1* | 12/2014 | Embid Droz | E21B 41/0092 703/1 |
| 2016/0186496 | A1* | 6/2016 | De Bakker | E21B 7/00 175/24 |
| 2016/0281497 | A1* | 9/2016 | Tilke | E21B 47/00 |
| 2017/0017883 | A1* | 1/2017 | Zhou | E21B 43/00 |
| 2017/0335662 | A1* | 11/2017 | Torrado | G06F 30/20 |

OTHER PUBLICATIONS

Mihaly Gajda (The Role of Uncertainty Assessment in Appraisal and Field Development Strategy, Society of Petroleum Engineers, Nov. 2016) (Year: 2016).*

Cunningham et al. ("Using the value of information to determine optimal well order in a sequential drilling program", AAPG Bulletin, 2008, pp. 1393-1402) (Year: 2008).*

Huntley et al. ("Normal Form Backward Induction for Decision Trees With Coherent Lower Previsions", Annals of Operations Research, 195(1):111-134, 2012) (Year: 2012).*

Litvake et al. ("Field Development Optimization with Subsurface Uncertainties", Society of Petroleum Engineers, 2011, pp. 1-12 (Year: 2011).*

H. Wang, D. Echeverría Ciaurri, L.J. Durlofsky and A. Cominelli, Optimal well Placement under uncertainty using a retrospective optimization framework, SPE Journal, 17(1), pp. 112-121, Mar. 2012.

R. Howard, R., Information value theory, IEEE Transactions on Systems Science and Cybernetics, 2(1), pp. 22-26, Aug. 1966.

P. Cunningham and S. Begg, Using the value of information to determine optimal well order in a sequential drilling program. AAPG Bulletin, 92(10), 1393-1402, Oct. 2008.

F. Demirmen, Subsurface appraisal: The road from reservoir uncertainty to better economics, paper SPE-68603-MS presented at the SPE Hydrocarbon Economics and Evaluation Symposium, Dallas, Texas, USA, Apr. 2-3, 2001, pp. 1-7.

E.G.D. Barros, P.M.J. Van den Hof and J.D. Jansen, Value of information in closed-loop reservoir management, Computational Geosciences, 20(3), 737-749, Aug. 4, 2015.

T. Wen, D. Echeverría Ciaurri, Mr. Thiele, Y. Ye and K. Aziz, How Much is an Oil Price Forecast Worth in Reservoir Management?, paper B41 presented at the 14th European Conference on the Mathematics of Oil Recovery (ECMOR XIV), Catania, Italy, Sep. 8-11, 2014, pp. 1-16.

Peter Mell and Timothy Grance, The NIST Definition of Cloud Computing, Special Publication 800-145, Computer Security Division, Information Technology Laboratory, National Institute of Standards and Technology, Gaithersburg, MD 20899-8930, Sep. 2011, pp. cover, i-iii and 1-3.

* cited by examiner

| action | appraisal outcome | action | action | action | action | appraisal outcome | action | action | scenario completed |
|---|---|---|---|---|---|---|---|---|---|
| P | 1 | W1 | W4 | W2 | | | | | DS1 |
| | 2 | W1 | W4 | | P | 1 | W3 | --- | DS2 |
| | | | | | | 2 | W3 | --- | DS2 |
| | | | | | | 3 | W2 | --- | DS1 |
| | | | | | | 4 | W3 | --- | DS2 |
| | 3 | W3 | | P | | 1 | W1 | W4 | DS2 |
| | | | | | | 2 | W1 | W4 | DS3 |
| | | | | | | 3 | W2 | --- | DS3 |
| | | | | | | 4 | W2 | --- | DS1 |
| | 4 | W2 | | P | | 1 | W1 | W4 | DS1 |
| | | | | | | 2 | W1 | W4 | DS3 |
| | | | | | | 3 | W3 | --- | DS3 |
| | | | | | | 4 | W3 | --- | DS3 |

| Uncertain parameter | 0.000 | 0.125 | 0.250 | 0.375 | 0.500 | 0.625 | 0.750 | 0.875 | 1.000 |
|---|---|---|---|---|---|---|---|---|---|
| DS1 | 125 | 115 | 105 | 95 | 85 | 75 | 65 | 55 | 45 |
| DS2 | -10 | 10 | 30 | 50 | 70 | 90 | 110 | 130 | 150 |
| DS3 | 100 | 100 | 100 | 100 | 100 | 100 | 100 | 100 | 100 |
| Number of appraisal wells | 0 | DS3 | | | | | | | |
| | 1 | DS1 | | | | DS2 | | | |
| | 2 | DS1 | | DS3 | | DS3 | | DS2 | |

| A | B | C | D | E | F | G | H | I |
|---|---|---|---|---|---|---|---|---|
| Geological realization (value of uncertain parameter) | W1→W4→DS1 | W3→DS3 | Geological realization (value of uncertain parameter) | | W1→W4→DS1 | p→ W3→DS3 | max(E, F) | max(B, C, H) |
| 1 (0.250) | 105 | 100 | 1 (0.125) | | 115 | 100 | 115 | 107.5 |
| 2 (0.750) | 65 | 100 | 2 (0.375) | | 95 | 100 | 100 | 100 |
|  |  |  | 3 (0.625) | | 75 | 100 | 100 |  |
|  |  |  | 4 (0.875) | | 55 | 100 | 100 |  |

FIG. 10

ADAPTIVE RESOURCE RESERVOIR DEVELOPMENT

BACKGROUND

The present invention relates to subterranean fluid resources, and, more particularly, to resource field development planning and the like.

The current practice in oil companies consists of designing a single deterministic reservoir development plan, which describes a single location and trajectory for each one of the wells to be drilled. This can be achieved in many different ways: by using an expert's judgment and/or optimization algorithms; by considering a single best guess scenario and/or different scenarios to account for uncertainty. Sometimes, the deterministic plan is selected from a set of potential plans, based on comparing a statistical average of performance metrics for each plan in a variety of geological realizations. In any of these cases, the current practice still has as its goal to determine a single deterministic plan. The argument supporting this practice is that there is only one "ground truth" and, therefore, there is only one plan that can be implemented.

SUMMARY

Principles of the invention provide techniques for adaptive resource field development, in which a multi-branch decision tree is provided that incorporates multiple development plans corresponding to multiple potential field realizations. In one aspect, an exemplary method includes determining a plurality of development scenarios; drilling at least a first well at a first location and trajectory that are common to the plurality of development scenarios; assessing a result of the at least one first well; and drilling a first sequence of subsequent wells at a first sequence of subsequent locations and trajectories that are common to a first subset of development scenarios, wherein the first subset includes at least one development scenario that is selected from the plurality of development scenarios based at least on the result of the first well, wherein the first sequence of subsequent wells includes at least one well.

In another aspect, an exemplary method includes drilling a first appraisal well at a first appraisal location and trajectory; drilling a first sequence of production wells at a first sequence of production locations and trajectories selected based on results of the first appraisal well; drilling a second appraisal well at a second appraisal location and trajectory; and drilling a second sequence of production wells at a second sequence of production locations and trajectories based on results of the first and second appraisal wells. The first appraisal location and trajectory are determined a priori while at least the first sequence of production locations and trajectories and the second sequence of production locations and trajectories are selected later from a plurality of development scenarios determined a priori.

Other embodiments of the invention provide a computer program product that includes a computer readable storage medium, which embodies computer executable instructions which when executed by a computer cause the computer to facilitate receiving, at a technological tree (TT) builder module, a set of development scenarios, each development scenario comprising a combination of well locations and trajectories corresponding to appraisal wells and production wells; building, in the technological tree builder module, a technological tree based on the set of development scenarios; receiving, at the development manual production module, a set of geological realizations; modeling, in the development manual production module, performance metrics for each of the development scenarios for each of the set of geological realizations; based on the TT and modeled performance metrics, identifying decisions at each internal node of the TT; and based on the TT and decisions to be made at each its node, producing a pre-calculated resource field development manual in the development manual production module.

Other embodiments of the invention provide an apparatus that includes a memory and at least one processor. The processor is operative to facilitate receiving, at a technological tree builder module, a set of development scenarios, each development scenario comprising a combination of well locations and trajectories corresponding to appraisal wells and production wells; building, in the technological tree builder module, a technological tree based on the set of development scenarios; receiving, at the development manual production module, a set of geological realizations; modeling, in the development manual production module, performance metrics for each of the development scenarios for each of the set of geological realizations; based on the TT and modeled performance metrics, identifying decisions at each internal node of the TT; and based on the TT and decisions to be made at each of its internal nodes, producing a pre-calculated resource field development manual in the development manual production module.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide one or more of the following advantages:

Enhanced productivity of newly developed resource fields by comparison to conventional development practices.

Reduced drilling costs per unit of cumulative resource production.

Rapid adaptation of resource field development plans in response to evolving information on geological parameters.

Robust decision-making that incorporates opportunities to deal with uncertainty.

These and other features and advantages of the present invention will become apparent from the following detailed description of illustrative embodiments thereof, which is to be read in connection with the accompanying drawings.

BRIEF DESCRIPTION OF THE DRAWINGS

FIG. 7 depicts in tabular form a reservoir development manual calculated according to FIG. 5;

FIG. 10 shows in tabular form a step of identifying an optimal development scenario for a plurality of geological realizations;

DETAILED DESCRIPTION

Figure 1:
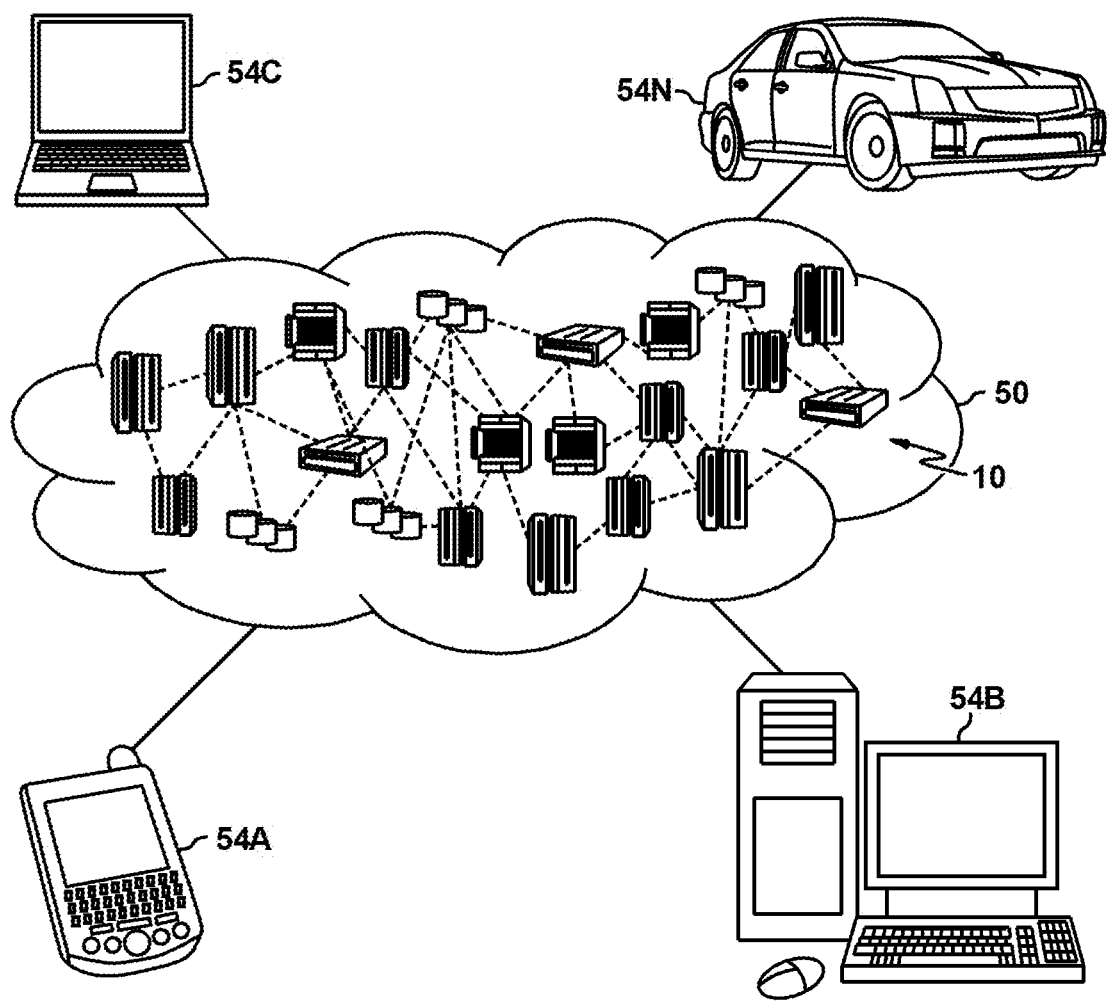
FIG. 1 depicts a cloud computing environment according to an embodiment of the present invention.

The subject matter of the instant application will be described with reference to illustrative embodiments. Numerous modifications can be made to these embodiments and the results will still come within the scope of the invention. No limitations with respect to the specific embodiments described herein are intended or should be inferred.

Although a particular embodiment of the invention is described in detail herein with reference to the development of oil fields, it is to be understood that the invention is equally applicable to other subterranean fluid resources, e.g., natural gas, fresh water, or geothermal steam.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 1, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
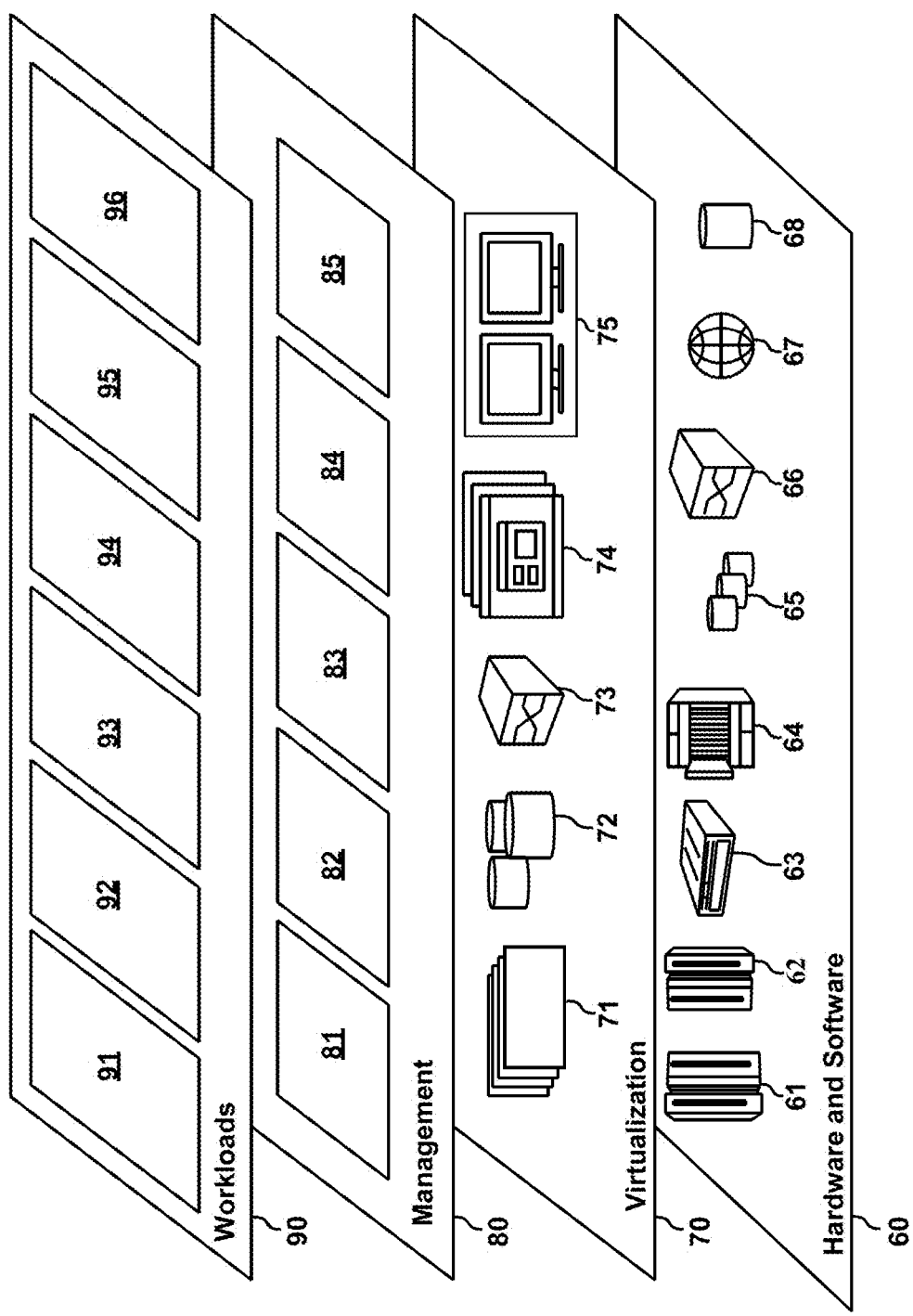
FIG. 2 depicts abstraction model layers according to an embodiment of the present invention.

Referring now to FIG. 2, a set of functional abstraction layers provided by cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and adaptive resource field development planning 96.

As discussed above, conventional techniques for oil reservoir development planning involve designing a single deterministic reservoir development plan with a single location/trajectory (though possibly including multilateral completions) for each one of the wells to be drilled. Sometimes, the single plan is arrived at by comparing a plurality of potential plans based on calculation of some common performance metric for each of the plans. For example, cumulative oil production may be calculated for each plan. However, accuracy in such calculations requires knowledge of subsurface structures (a geological model of the oil field) that is, in general, not available before wells have been drilled. Accordingly, it is usually not possible to accurately calculate the common performance metric. This raises the question how to select among the plurality of potential drilling plans.

One known solution is to calculate a performance metric for each one of a set "D" of potential drilling plans, across a set "M" of possible geological realizations or reservoir models. The result of such calculation is a D×M matrix of possible performance metrics. The columns of the matrix (each column corresponding to a drilling plan) can then be compared. For example, the columns can be compared on the basis of some statistical averaging of the values within each column. Another option might be to compare the magnitudes of the columns. In any case, based on the a priori comparison, a single deterministic reservoir development plan is selected to yield an optimal value of the comparison.

According to conventional methods, the set M can be limited by drilling a priori (before determining a single deterministic development plan) one or more "appraisal wells," which are wells drilled for the purpose of taking measurements before drilling production wells for the purpose of extracting fluid resources. Using the measurements from appraisal wells, it is possible to simulate subsurface structures that might be consistent with those measurements. Such simulations necessarily are probabilistic and yield a relatively large set M for each measurement; multiple measurements can reduce the scale of the set M. However, the tight schedule of reservoir development typically does not give an opportunity for precise measurements at the outset of drilling. The development team needs to drill production wells as a first priority, and perform additional research only occasionally. The result is extensive geological uncertainty due to limited knowledge about the subsurface, so that an initially optimal drilling plan (the single deterministic reservoir development plan arrived at by conventional methods) may no longer be optimal as more wells are drilled and additional knowledge about the reservoir becomes available.

Thus, it would be advantageous to adapt a reservoir development plan based on evolving information, according to embodiments of the invention. Unfortunately, the conventional approach to evaluating well measurements is to design an updated or augmented set of development scenarios (that take into account the production wells that have been drilled so far) and entirely recalculate a simulation of subsurface structures for each new set of measurements. This conventional approach is usually computationally intensive and time-consuming, and does not fit within the typically rapid production drilling schedule so as to permit meaningful adaptation of a pre-determined drilling plan. Thus, it would be advantageous to adapt a reservoir development plan based on new information, in a rapid manner that does not require intensive recalculation associated with new measurements. Embodiments of the invention provide for such rapid adaptation.

More particularly, embodiments of the invention advantageously allow for development plans to be defined incorporating some degree of flexibility that allows for adaptation in response to evolving information on geological realizations, as opposed to current practices based on a deterministic plan which does not provide flexibility for locations and/or trajectories of new wells despite uncertainty in field parameters. Based on the information provided by ongoing field exploration during drilling, the development team can adapt the drilling scenario dynamically. The invention provides a fully automatic tool that tells the operator what to drill based on the results obtained from appraisal wells that the operator enters into the system.

Although the present application describes primarily a reservoir development application based on oil production by water flooding in which the reservoir contains oil and water, but there is no gas, one skilled in the art will understand that inventive techniques may be utilized in other contexts, such as oil production through other techniques, gas production, water well drilling, etc.

Embodiments of the invention provide for efficient and adaptive development of undeveloped oil fields (also known as "greenfields"). However, embodiments of the invention also are applicable to uncharacterized or only partly characterized portions of previously developed fields (brownfields). The invention can be applied in order to adaptively select an optimized drilling scenario by alternate drilling of production and appraisal (pilot) wells. An appraisal well is a non-production well that delivers additional local knowledge (reduces uncertainty on geological parameters of the field), which knowledge might not be relevant for other regions of the field. Drilling an appraisal well incurs cost and delays drilling of production wells. By drilling fewer appraisal wells at the beginning of the development process, we have a quick start of the drilling of production wells which, in turn, helps to reduce the time needed to return pre-development investments. On the other hand, having at least a few appraisal wells tends to yield better production well placement and higher overall field performance than having no appraisal wells. An aspect of the invention is that appraisal wells can be drilled interspersed with production wells and using the same drilling machinery. This approach saves on cost while permitting rapid adaptation of the reservoir development plan. Commonly found examples of reservoir development plan adaptations are adjustments of the number of production wells and of their locations (i.e., the adjustment of well density). Embodiments of the invention provide drilling schedules of production and appraisal wells for a multitude of technologically achievable production well arrangements with predefined well locations and depths. The schedules are generated so that at each stage the expected mean performance metric is maximized (very often an economic metric, e.g., net present value, is considered, but production metrics, e.g., cumulative oil production, can also be used).

Figure 3:
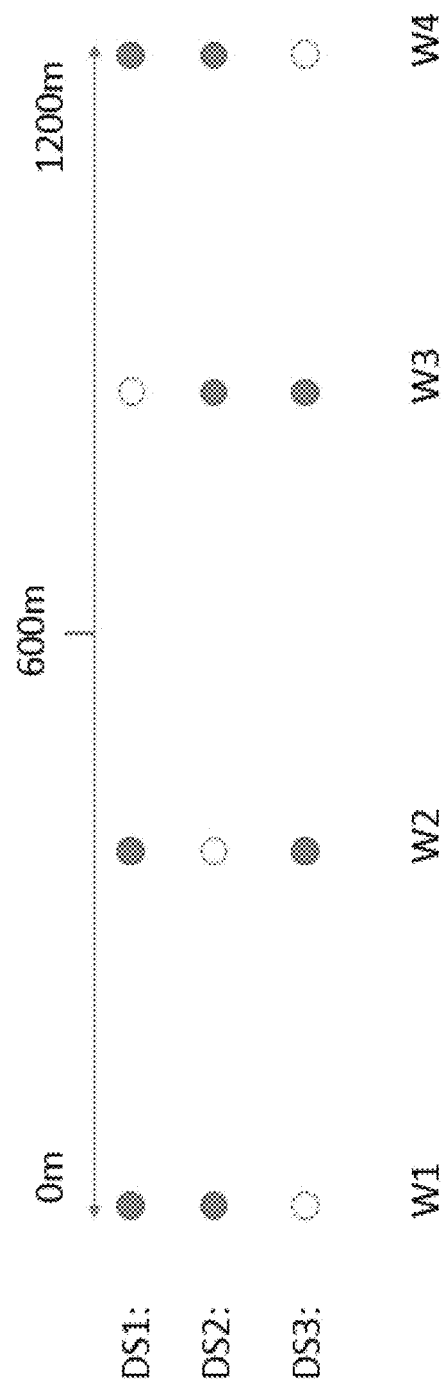
FIG. 3 shows in schematic form a plurality of reservoir development scenarios incorporating well locations and trajectories.

Referring now to FIG. 3, the invention contemplates in this example various reservoir development scenarios DS1, DS2 and DS3 under geological uncertainties. Each development scenario (DS) includes a list of activities to be performed during the development of a reservoir (for example, installation of production facilities and infrastructure, drilling of production wells of specified depths at predefined locations, drilling and obtaining information from appraisal wells, obtaining information from previously drilled production wells). A DS can specify complex temporal dependencies between activities (for example, drilling of two appraisal wells, one immediately after another may be prohibited). Some activities of a DS must be completed fully (for example, drilling of production wells), and some other activities may be totally ignored during the implementation of a scenario (for example, a DS may allow for drilling of fewer number of appraisal wells compared to the maximum number of appraisal wells allowed in the scenario). An implementation of a DS is a process of performing activities specified in the DS taking into account their dependencies. A DS is fully implemented when all activities of a DS that must be completed fully have been performed. Depending on geological parameters of the field (which are not known with certainty even after all the appraisal wells have been drilled and evaluated), different DSs may be optimal for developing the field. Embodiments of the invention help the operator to adapt the development of a reservoir by selecting among the various a priori DSs, based on additional information about field parameters that is obtained during development according to the invention.

Exemplary actions under a DS include the following: Drill an appraisal well and analyze the results to reduce the reservoir uncertainty by eliminating geological realizations that are not consistent with the appraisal results. Choose a location and trajectory of a production well, among all technologically allowed options, and drill it. Finish the drilling of wells for the reservoir.

For example, DS1 in FIG. 3 requires the drilling of three production wells W1, W2 and W4. DS2 requires drilling three production wells W1, W3 and W4. DS3 requires drilling only two production wells: W2 and W3. Each well is characterized by a location (e.g., GPS coordinates of the wellhead) and by a trajectory (i.e., a depth, an azimuth, and a horizontal distance that could be zero). For simplicity, FIG. 3 shows only a longitudinal coordinate of each well in the moving direction of the drilling machinery.

The mutual underground arrangement of horizontal production wells is restricted by the following technological limitations: The separation between the closest wells should lie in some predefined range. The wells could be drilled out of order, but the number of wells drilled out-of-order might be limited. The first limitation is taken into account by the appropriate choice of well patterns.

Although the location and trajectory of each potential production well has been pre-determined based on the pre-development data from field sensors, including the initial appraisal well(s), the different development scenarios lay out distinct sequences of locations and trajectories that correspond to distinct sequences of production well drilling. Which sequences are accomplished in which order can be determined according to embodiments of the invention, as further described with reference to FIGS. 4-7 and 11.

Embodiments of the invention comprise two parts. The first part is a method that creates a pre-calculated manual to be used during the development of a reservoir. The second part is a method that utilizes this pre-calculated development manual to dynamically adapt a development plan in response to discovered information about geological parameters of the field under development.

Figure 4:
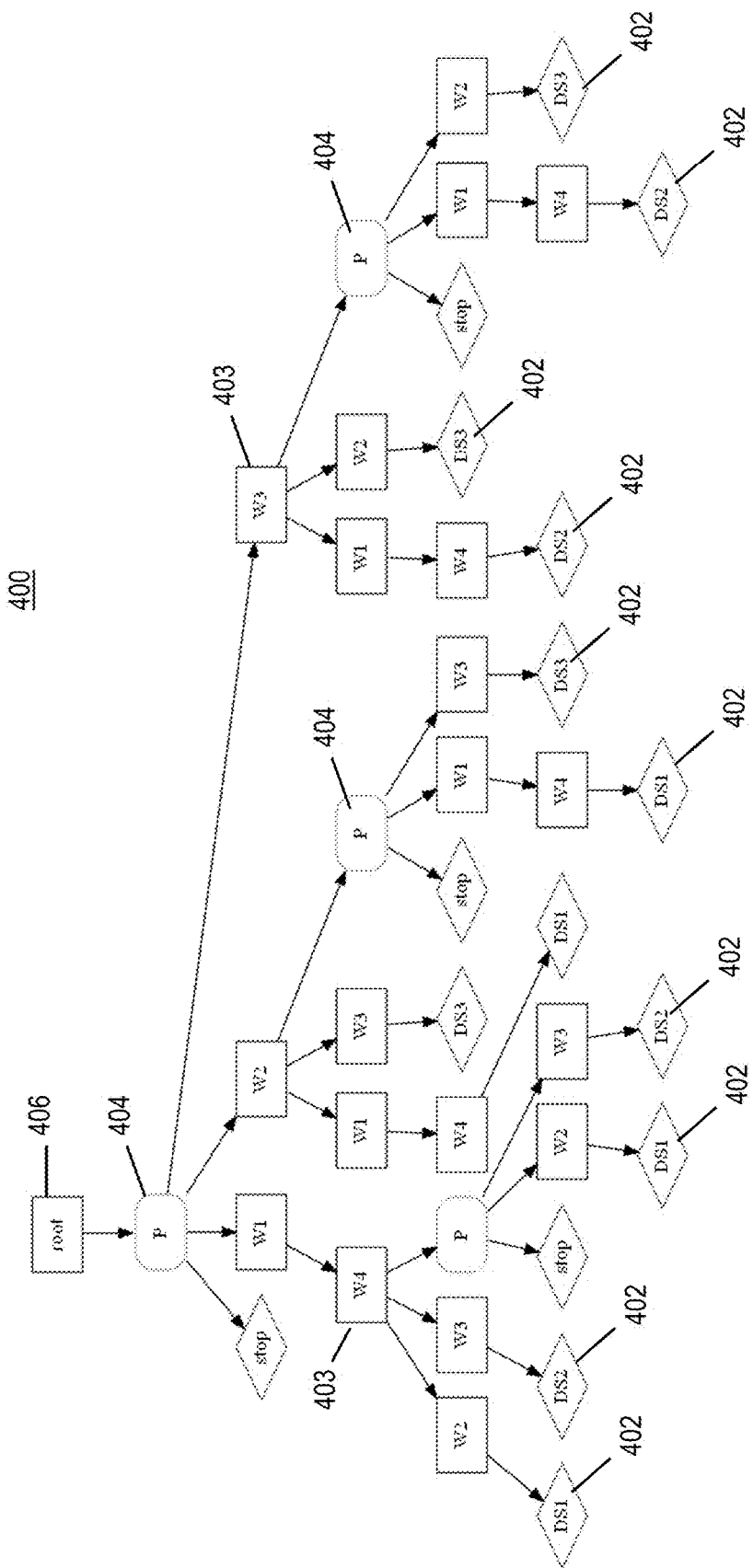
FIG. 4 depicts a technological tree for an adaptive reservoir development plan that accounts for the various development scenarios shown in FIG. 3, according to embodiments of the invention.
Figure 5:
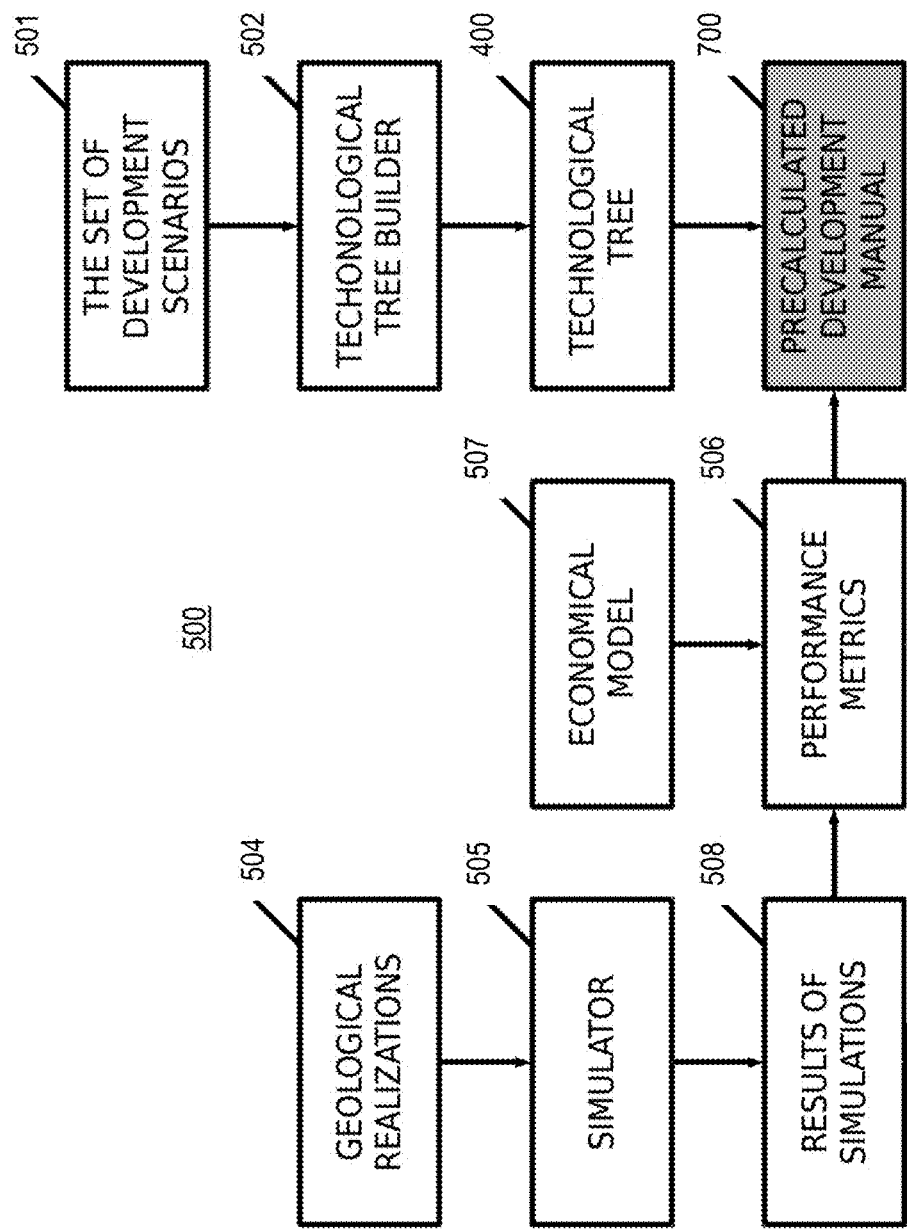
FIG. 5 shows a flowchart for pre-calculating a reservoir development manual based on a set of geological realizations, on an economical model, and on a set of development scenarios.
Figure 6:
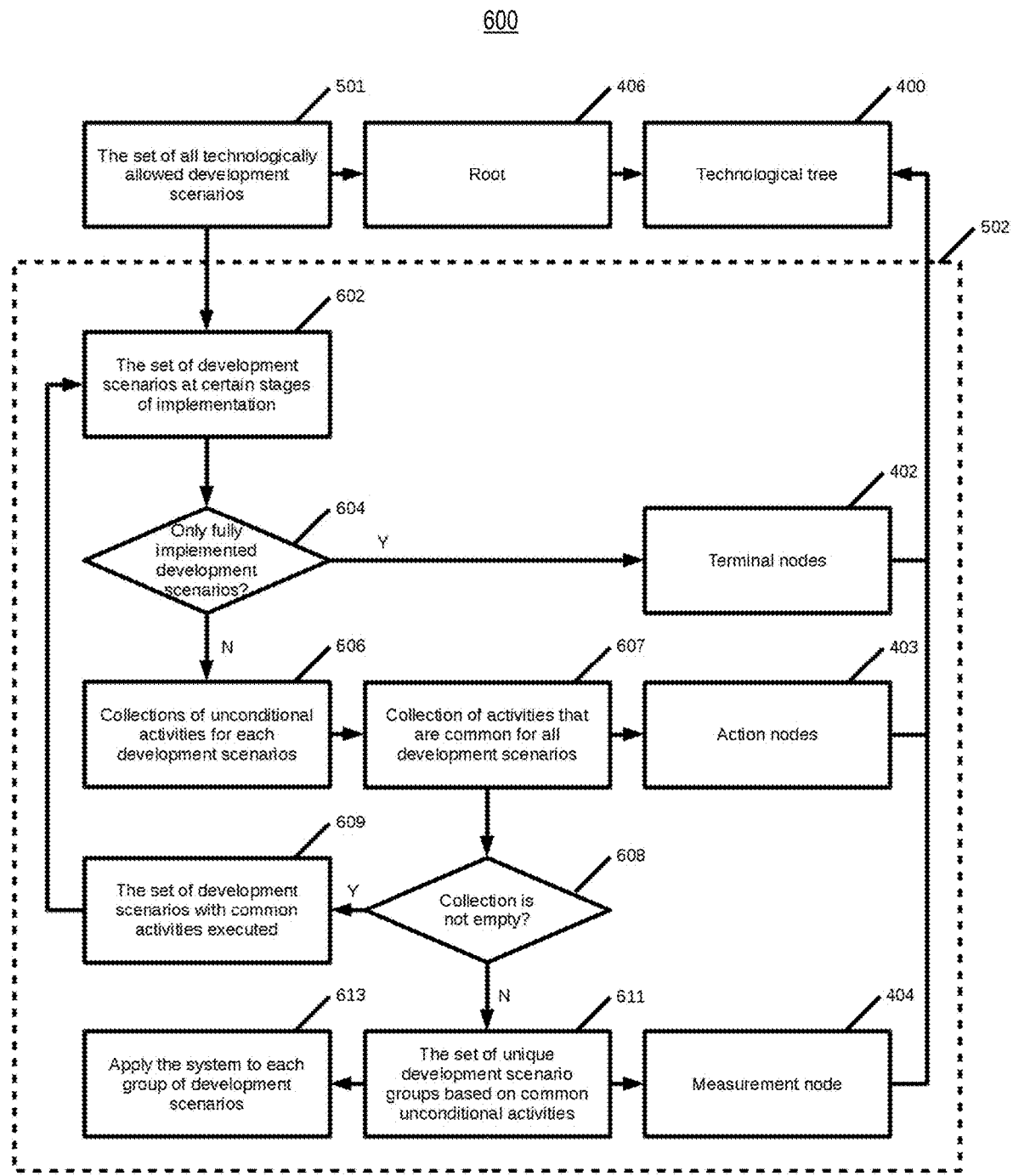
FIG. 6 shows a flowchart for building a technological tree (FIG. 4 shows an example of a technological tree built according to the process of FIG. 6), according to embodiments of the invention.

FIGS. 4-6 depict, as a first part of the invention, how the pre-calculated development manual is built according to the following three-step procedure:

1. Representation of all possible transitions between implementation schedules of development scenarios in a form of a hierarchical structure (technological tree 400, shown in FIG. 4). The tree 400 has leaves or terminal nodes 402, nodes where transition between development scenarios happen (internal nodes) 403 and 404, and a root 406. Each leaf 402 corresponds to one development scenario. After building TT, we calculate performance metrics for possible geological models in each leaf according to the path from the root to the leaf taking into account the appraisal wells. Thus, the leaves 402 correspond either to completion of a DS or to a halt of drilling due to negative evaluation of performance metrics for any allowed DS.

Each internal node 404 ("P") corresponds to an immediate measurement event (e.g., get information from appraisal well), which produces a result that can be used to eliminate one or more of the leaves 402—i.e. a result that is consistent with only some of the geological realizations in the set M. We will denote these nodes "P" nodes. For example, consider a set of reservoir models where each model corresponds to the value of a given uncertain parameter, for example, some average value of the rock porosity in the reservoir, which, in this example, may take values in the interval [0.1, 0.2]. Different porosity values would imply different physics and, in turn, different fluid production. In this simple example, let's say that the interval [0.1, 0.15] corresponds to a reservoir with relatively LOW average porosity and the interval [0.15, 0.2] to a reservoir with relatively HIGH porosity. Notice that particular measurements and interpretation techniques (i.e., well porosity logs) give information about that specific property (i.e., porosity) in an area of the reservoir close to where the measurements are taken, i.e. close to the appraisal well. Additionally, there is uncertainty in these measurements. Taking all this into consideration, one set of measurements does not allow to exactly say that the average porosity in the reservoir is, e.g., 0.12. Rather, limited measurements permit an estimate that the reservoir has relatively LOW average porosity (i.e., the porosity values close to the measurements may be around 0.12; however, in the rest of the reservoir the value could be different and, for some other reasons related to other measurements or information available, significant variation of porosity in the reservoir is not expected, so on average there are values of porosity in the interval [0.1, 0.15] that yield acceptable predictions of fluid flow, exemplary performance metric, for a particular subset of development scenarios). Thus, "P"-node would imply "drill appraisal well and choose next action based on the outcomes of previous appraisals as well as the just obtained appraisal."

Between the "P" nodes 404 are production well nodes 403 ("W1", "W2", "W3" and "W4" in FIG. 4) that correspond to drilling of the various wells described with reference to the development scenarios of FIG. 3. We will denote these nodes as action nodes or "W" nodes. Data from production wells (e.g., flow data) is obtained only with some lag time, which, in some cases, is not economical to wait. Accordingly, "W"-node would imply "drill production well and choose the next action based on the outcomes of previous appraisals."

2. Evaluation of expected value of performance metric for every implementation of each development scenario in each geological realization (method 500, FIG. 5).

3. Identification of decisions at each point of transition between implementation schedules by means of backward induction approach (further discussed below with reference to FIGS. 5 and 8-10).

The technological tree 400 represents all the possible actions that the user may perform (i.e., "P", which denotes drilling a pilot/appraisal well; "W1", "W2", "W3" and "W4", which denote drilling production well W1, W2, W3 or W4 already identified in the possible development scenarios (see FIG. 3); "DS1", "DΩ" and "DS3", which denote completing the previously specified reservoir development scenarios; or "stop", which denotes terminating the drilling process). Each node in the technological tree includes a table of the associated performance metrics computed (e.g., oil production volume, or net present value) that correspond to the various outcomes of the reservoir development (including possible measurements at pilot/appraisal wells) that lead to or go through the node (the user may have access to these metrics via the graphical user interface when clicking or directly touching the node on a screen). Although not shown in the tree above, each branch that goes from any "P" node of the tree (i.e., a node that implies gathering some additional information and proceeding down in the tree based on that information) may also be labeled and include the data actually measured (after the data measurement procedure has already taken place).

FIG. 5 depicts in flowchart form a method 500 for producing a pre-calculated development manual 700, based on the development scenarios shown in FIG. 3. During the method 500, we evaluate the expected value of the chosen performance metric (e.g., net present value or oil production volume) for every implementation of each development scenario (i.e., at each terminal node 402 of the TT developed by the system 600). This evaluation is performed for every probability distribution of uncertain parameters that might be obtained as a result of appraisals or analysis of production data from production wells drilled as part of a scenario. Such probability distribution is represented by means of a set of geological realizations 504 that can be one of the sets of M reservoir models discussed above. The behavior of each geological realization, among the set of M reservoir models, is modeled by means of a reservoir flow simulator 505. The evaluation of performance metrics 506 can be accomplished by applying an economic model 507 to the results of the simulations 508. Alternatively, the performance metrics 506 can be pure physical metrics, e.g., cumulative resource production, in which case, the economic model 507 may be omitted. Finally, the technological tree builder 502 undertakes the identification of decisions at each internal node 403 or 404 by means of backward induction approach.

That is, to create the pre-calculated development manual 700, the method proceeds upward from estimated performance metrics 506 at each leaf 402 of the TT 400, computing the maximum expected value of the performance metrics at each internal "P" node 404 and "W" node 403. The input for the backward induction algorithm is the technological tree 400 with expected values of performance metric mapped to each leaf 402 of the tree (each geological model that may be considered at a leaf has its own value of performance metric). We assume that each leaf 402 is associated with one development scenario DS, but consider that one scenario may appear at several leaves; the specific order of production wells and the number of appraisal wells that precedes these leaves may differ. The output of the algorithm is the accumulated performance metric for each internal node 403 and 404 (more precisely, the metric is accumulated for each geological model that may be considered at a node). This collection of metrics can be used to dynamically find the path in the tree from the root 406 to the leaf 402 with the best expected value, subject to unknown and possible research/measurement outcomes (for example, from appraisal wells).

The backward induction algorithm proceeds upward layer-by-layer from the bottom (leaves) to the top (root). If an internal node does not provide additional information regarding uncertain parameters (e.g., in the current embodiment, a node that corresponds to the drilling of a production well), the metric associated with each geological model that may be considered at the node is the best expected value through all descendants (where each descendant encompasses the best expected value until the bottom of the tree). Otherwise, if it is possible to get additional information (e.g., in the current embodiment, a "P" node 404 that corresponds to the research performed with an appraisal well), the metric for each geological model that may be considered at the node can be found by averaging over all submodels considered at the children of that node.

Thus, the initial input for the method 500 includes the following: A set 501 of well arrangements (development scenarios) allowed for the reservoir; and a set of geological realizations 504. In other words, the method 500 receives a plurality of development scenarios DS1 . . . DS3, each development scenario comprising a combination of well locations and trajectories corresponding to appraisal wells and production wells. After also receiving the set M of geological realizations or reservoir models, the method 500 proceeds to modeling performance metrics 506 for each of the development scenarios for each of the set of geological realizations. Thus, values 506 of the performance metric are obtained through simulations 505 for each representative geological realization for each well arrangement. There is an infinite number of geological realizations, as geological parameters may, in general, have any values within the uncertainty intervals. In certain embodiments of the invention, we choose to simulate 505 the behavior of the reservoir for a small number of geological realizations so that we may estimate the results for intermediate values; the number can be selected based on experimental design principles in light of the known parameters. Separately, the method 500 builds 502 a technological tree 400 that describes the set of development scenarios. Based on the simulations 505, the method 500 identifies decisions at internal nodes of the technological tree (see method 600, FIG. 6). Based on the decisions at internal nodes of the technological tree, the method 500 produces a pre-calculated development manual 700 that schedules optimal well drilling sequences to accomplish the various DSs in light of evolving field measurements (e.g., production well flow, appraisal well pressure).

FIG. 6, to which we now refer, depicts in greater detail the implementation of a development planning system 600 that produces the technological tree 400 of FIG. 4 from the plurality of technologically feasible (allowed) DSs shown in FIG. 3, according to the TT builder method 502. The system 600 may be facilitated by a single computer such as the computer discussed with reference to FIG. 12, below; alternatively, the system 600 may be facilitated by the cloud computing environment 50. Initially, the system 600 receives the set 501 of allowed DSs as an input 602. At the same time, the system creates the root node 406 of the TT. If all DSs of the set 501 are fully implemented (604, Y), then the system generates one of the terminal nodes 402 for the TT. If some DSs of the set 501 are not fully implemented (604, N), then for each DS of the set the system forms a collection 606 of activities (referred here as "unconditional") whose temporal dependencies are fully satisfied. Then, the system takes the intersection of those collections to form a new collection 607 of unconditional activities that are common for all DSs. If the collection 607 is not empty (608, Y), the system marks the respective activities as completed at each DS and forms an updated set 609 which is passed as a new input 602 back to the system. At the same time, the collection of common activities is put into the TT as a sequence of actions 403. On the other hand, if the collection 607 is empty (608, N), the system 600 forms a set 611 of unique DS groups based on common unconditional activities they have. (For example, and referring also to FIG. 3, if DS1 has activities "W1", "W2" and "W4", DS2 has activities "W1", W3" and "W4", DS3 has activities "W2" and "W3", then the set 611 would contain the following DS groups: (DS1, DS2), (DS1, DS3), (DS2, DS3).) This division of the set leads to a creation of an internal node "P" 404 (FIG. 4) of the TT. Finally, each DS group is passed 613 as a new input 602 to the system 600. The combined outputs 402, 403, 404, and 406 form the complete TT 400 that is shown in FIG. 4 and that represents the transitions between implementation schedules of each development scenario.

FIG. 7 shows an example of the pre-calculated development manual 700 in a form of the tabular output that could be generated as the result of the three-step procedure above. The table represents the order at which production wells should be drilled at specified positions ("W1", "W2", "W3" and "W4") based on the research outcomes (numbered as "1", "2", "3" and "4") from appraisal wells ("P"). The columns in the table represent types of actions. The fields in the cells give more details about the specific actions. As time goes by the operator reads the cells from left to right and performs the designated actions. For example, the "P" symbol in the leftmost cell tells the operator to start the development of a given region in the field with the drilling of an appraisal/pilot well. The symbol "---" means that no further actions are required. Finally, the last column of the manual lists the names of the previously defined, possible development scenarios ("DS1", "DS2" and "DS3") that are finally implemented as a result of the corresponding measurements and actions. Optionally, in addition to the specific actions to be performed, each cell of the development manual may include the expected value of the performance metric associated with that cell or some related information, such as any production quantity that varies with time (note that these values and information are available because all related computations were performed at step 505 of the method 500). Referring specifically to the numbered research outcomes after outcome of an appraisal well, which are provided only as examples of one implementation of a pre-calculated development manual, these correspond to ranges or intervals of possible values for an initially uncertain parameter.

Figures 8, 9:
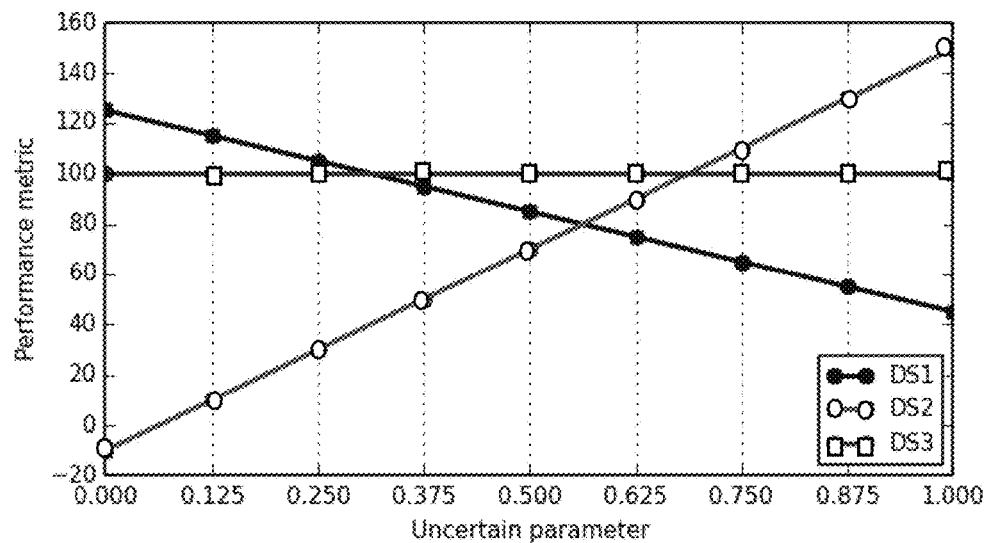
FIG. 8 shows graphically relationships between values of an uncertain parameter and values of an estimated performance metric for different development scenarios.
FIG. 9 shows in tabular form the data of FIG. 8 along with the development scenarios that maximize the performance metric for some values of the uncertain parameter.

Referring to FIGS. 8-10, consider, as another example, that normalized values of an uncertain parameter may vary from 0.0 to 1.0. Without any appraisal well, the possible values that this uncertain parameter can take are in the interval [0.0, 1.0]. With one appraisal well, assume that the measurements associated with this appraisal well allow us to determine that the values that this uncertain parameter can take are either in the interval [0.0 0.5] or in the interval [0.5 1.0] (the selection of the interval depends on the measurements obtained). For two appraisal wells, we assume that the measurements associated with these two appraisal wells allows us to determine that the values that this uncertain parameter can take are either in the interval [0.0 0.25], in the interval [0.25 0.50], in the interval [0.50 0.75] or in the interval [0.75 1.0] (the selection of the interval depends on the measurements obtained).

Let the dependence between the value of this uncertain parameter and the performance metric be expressed as shown in the graph of FIG. 8 and the table of FIG. 9. FIG. 8 shows the predicted value of a performance metric for each development scenario (DS1, DS2 and DS3) as a function of the uncertain parameter. FIG. 9 shows, additionally, which of the development scenarios would maximize the performance metric for some values of the uncertain parameter.

Given an interval for the uncertain parameter, we could determine the best development scenario associated with this interval by computing the corresponding area in FIG. 8. This area can be estimated in a number of ways. In this analysis this area will be estimated by the value of the performance metric at the center of the interval multiplied by the interval length. Consistent with this:

If we do not plan to drill appraisal wells, we consider in the analysis one geological realization characterized by a value of the uncertain parameter equal to 0.500.

If we plan to drill one appraisal well we consider in the analysis two geological realizations characterized by the values of the uncertain parameter equal to 0.250 and 0.750.

If we plan to drill two appraisal wells, we consider in the analysis four geological realizations characterized by the values of the uncertain parameter equal to 0.125, 0.375, 0.625, and 0.875.

For different numbers of appraisal wells, we consult the table of FIG. 9 in order to determine the best development scenario based on the maximal value of the performance metric in the corresponding interval.

Now, consider how a decision table, such as the table of FIG. 10, is used during the backward induction process to identify decisions at the internal "P" nodes of a technological tree.

Consider a sub-tree with the root "W2" (that can be reached as "root"→"P"→"W2"). The leaf that is associated with development scenario "DS1", which is reached as ("root"→"P"→"W2")→"W1"→"W4"→"DS1", has one appraisal well ("P" node) 404. That means that we need to consider two geological realizations for this scenario (which are associated with the values of the uncertain parameter 0.250 and 0.750). Similarly, we consider these two geological realizations for the leaf associated with development scenario "DS3", which is reached as ("root"→"P"→"W2")→"W3"→"DS3". The corresponding values of performance metric are shown in columns "B" and "C" of the table shown in FIG. 10.

The development scenario "DS1" that is reached as ("root"→"P"→"W2")→"P"→"W1"→"W4"→"DS1" has two appraisal wells. That means that we need to consider four geological realizations for this scenario (which are associated with the values of the uncertain parameter 0.125, 0.375, 0.625 and 0.875). Similarly, we consider these four geological realizations for the development scenario "DS3" that is reached as ("root"→"P"→"W2")→"P"→"W3"→"DS3". The corresponding values of performance metric are shown in columns "E" and "F" of FIG. 10.

In order to determine at the node "P" (that is reached as ("root"→"P"→"W2")→"P") the favorable development scenario for each of four geological models that may be realized, at this point we take the maximum value over development scenarios (see column "G" of FIG. 10).

Before we drill the second appraisal well, we consider two geological realizations. In order to populate the tree consistent with the first appraisal well, i.e., two intervals, we should map the four intervals obtained after the second appraisal well to the two intervals associated with the first appraisal well. That can be done by averaging values of the performance metric for the first two and the second two intervals (see column "H").

Finally, in order to determine the favorable development path associated with the level of the tree where we have two intervals as a result of the research/measurements performed with the first appraisal well (i.e., at the node "W2" that is reached as "root"→"P"→"W2"), we proceed in similar fashion as for column "G" and take the maximum value over the branches for each of the two geological realizations (see column "I").

The exemplary development manual shown in FIG. 7 categorizes the potential results of each measurement "P" among four discrete outcomes ("1"-"4") shown in the next column. The number of these outcomes depends on the data measured and may alternatively have some descriptive labels (e.g., when measuring the property "permeability" we may have "very low", "low", "high", and "very high" values of this property). Generally, the outcomes correspond to intervals of value for some uncertain parameter, as discussed above with reference to FIGS. 8-10.

Let us assume that in this example the measurement performed with the appraisal well delivered the outcome labeled as "2". That means that the next actions of the operator should be drilling of wells "W1" and "W4" followed by drilling of the second appraisal well. Note that the technological tree of FIG. 4 has branches that do not appear in the table. This is because these branches (once the backward induction process was applied) were identified as having lower performance metric than other branches, and for that reason it does not make sense to provide as possible actions that the operator may perform.

Upon receiving the outcome of the first appraisal measurement, the operator may decide to eliminate the actions associated with the other outcomes (i.e., the first, the third, and the fourth rows, assuming the outcome is "2"). This leaves the operator with only those instructions that could potentially follow further. The deletion of the abovementioned rows, again, assuming the outcome is "2", corresponds to the pruning of the following branches that go from the uppermost "P" node of the technological tree shown in FIG. 4: (1) branch that leads to the "stop" terminal node, (2) branch that leads to the sub-tree with the "W2" node and (3) branch that leads to the sub-tree with the "W3" node. Note that the sub-tree after "W4", formed by the branches starting with "W2" and "W3", can be removed as well. (Since the manual is pre-calculated, no additional entities in the tree are created as a result of the new data obtained from the reservoir.)

Figure 11:
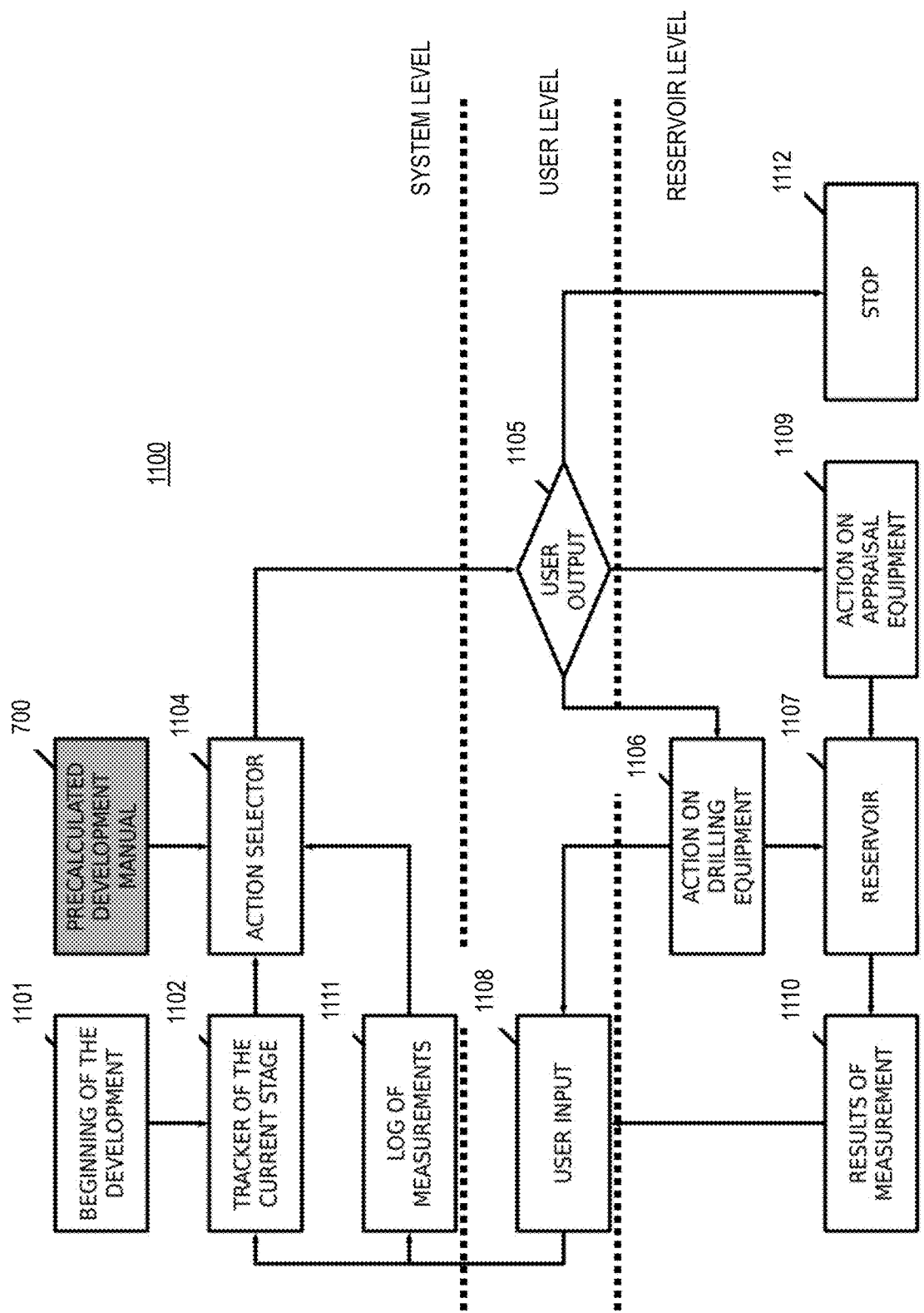
FIG. 11 shows a flowchart for developing a resource field by an adaptive reservoir development plan, according to embodiments of the invention.

FIG. 11 shows, as a second part of the invention, how a pre-calculated development manual is implemented to dynamically adapt the development of an oil field. FIG. 11 depicts in flowchart form a method 1100 for utilizing the development manual 700 as developed by the method 500 of FIG. 5. At the beginning 1101 of greenfield development, a tracker 1102 of the current stage of the development is set to the root of the pre-calculated development manual 700. Based on that, an action selector (development manual implementation module) 1104 picks the very first action from the manual and provides 1105 this information as an instruction to a user or development operator. If the user is instructed to drill a production well, the user performs an action on the drilling equipment 1106. The drilling affects the reservoir 1107. Once the drilling is completed, the user informs 1108 the system of any measurements 1110 obtained from the reservoir. The user might be instructed to gather information about the reservoir properties using appraisal equipment 1109—for example, by drilling a first appraisal well at a first appraisal location and trajectory. It should be also noted that production well flow might inform further drilling decisions. Flow-related information from the production wells is, in general, not readily available, in contrast to the results of the analysis performed with appraisal wells. That means that we can consider flow information from the production wells only some time later in the development process. On the other hand, some other information (e.g., downhole pressure) may be immediately available. The development manual may be calculated to account for such immediate information.

In order to account for flow-related information from production wells, we may introduce some artificial nodes "Pw" that are similar to the "P" nodes. These "Pw" nodes are not associated with the drilling of appraisal wells. The geological realizations they induce are the result of the information from the corresponding production well that was drilled previously. These "Pw" nodes are added several layers down the tree at the tree level that corresponds to the moment in time when the flow-related information from the production well is considered. The nodes may be added to each development path that lies below the node that represents the production well that would provide the information.

The incorporation of the flow-related information from the production wells does not affect the process of construction of the pre-calculated development manual. The incorporation of the information from the production wells also does not affect the process of the usage of the pre-calculated development manual. The only difference is that the decision at "Pw" node is made based on the information from the previously drilled production well, rather than from a just drilled appraisal well.

Again, the user interacts with the reservoir 1107 and enters 1108 the results of the measurements 1110 into the system. Note that the field information 1110 can be introduced to the system as a purely manual data entry 1108, or, if available, through some automated acquisition system. The user input interface can also be integrated with an external system that provides the results of reservoir measurement data analysis (e.g., measurements performed through an appraisal well, fluid rates collected at the production wells, etc.). The user input 1108 results in the update of the measurements log 1111 and updates the bookmark on the current stage of the development 1102. Then, the action selector 1104 again picks from the manual 700 the next action based on the current stage 1102 and the full history of measurements 1111. Thus, for example, after drilling 1109 the first appraisal well the method 1100 might proceed to drilling 1106 a first sequence of production wells at a first sequence of production locations and trajectories, selected from the various development scenarios based on results of the first appraisal well. Note that a "sequence" of wells may include one or more wells, in a variety of orders.

Continuing the example with reference to the exemplary development manual of FIG. 7, the action selector 1104 might then instruct the operator to drill 1109 a second appraisal well at a second appraisal location and trajectory. Following from measurements 1110 on the second appraisal well, the potential set of geological realizations is limited. Considering that the projected performance metric for any allowed development scenario is above a threshold value (a positive result corresponding to the set of geological realizations consistent with the appraisal well measurements) the action selector 1104 then might instruct the operator to drill 1106 a second sequence of production wells at a second sequence of production locations and trajectories, selected from the various development scenarios based on results of the first and second appraisal wells.

Generally, the first appraisal location and trajectory are determined a priori while the first sequence of production locations and trajectories, the second appraisal location and trajectory, and the second sequence of production locations and trajectories are selected later from options (the development scenarios) that were determined a priori.

When the implementation of a development scenario is completed, or when the projected performance metric for any allowed development scenario falls below a threshold value (a negative result corresponding to the subset of geological realizations consistent with the appraisal well measurements), the system informs the user to stop 1112.

While operating, the method 1100 takes as preliminary input the pre-calculated development manual 700 and at each iteration the system asks for the following intermediate input 1108: the results 1110 of the geological research performed by means of the appraisal wells and by analysis of production logs from the production wells that were drilled as part of the procedure previously. The method 1100 provides the following output at each iteration: the order 1106 for the operator to drill a production well; the order 1109 for the operator to drill an appraisal well; or the order 1112 for the operator to drill no more wells for the reservoir.

Thus, certain embodiments of the invention provide for a computer-implemented method that includes receiving a set of development scenarios, each development scenario comprising a combination of well locations and trajectories corresponding to appraisal wells and production wells; building a technological tree that describes the set of development scenarios; receiving a set of geological realizations; modeling performance metrics for each of the development scenarios for each of the set of geological realizations; based on the modeled performance metrics, identifying internal nodes of the technological tree; receiving measurements from an appraisal well; and, by comparing the measurements to the modeled performance metrics at one of the internal nodes, selecting a sequence of production wells to be drilled.

Given the discussion thus far, it will be appreciated that, in general terms, an exemplary method, according to an aspect of the invention, includes determining a plurality of development scenarios 501; drilling 1106 or 1109 at least a first well at a first location and trajectory that are common to the plurality of development scenarios; assessing 1110 a result of the at least one first well; and drilling 1106 or 1109 a first sequence of subsequent wells at a first sequence of subsequent locations and trajectories that are common to a first subset of development scenarios, wherein the first subset includes at least one development scenario that is selected 1104 from the plurality of development scenarios based at least on the result of the first well, wherein the first sequence of subsequent wells includes at least one well. This exemplary method also may include assessing a result of the first sequence of subsequent wells; and upon a negative result of the first sequence of subsequent wells, ceasing drilling 1112; or upon any positive result of the first sequence of subsequent wells, drilling a second sequence of subsequent wells at a second sequence of subsequent locations and trajectories that are common to a second subset of the plurality of development scenarios, wherein the second subset includes at least one development scenario that is selected from the first subset based at least on the result of the first sequence of subsequent wells, wherein the second sequence of subsequent wells includes at least one well.

Another exemplary method includes drilling 1109 a first appraisal well at a first appraisal location and trajectory; drilling 1106 a first sequence of production wells at a first sequence of production locations and trajectories selected based on results of the first appraisal well; drilling 1109 a second appraisal well at a second appraisal location and trajectory; and drilling 1106 a second sequence of production wells at a second sequence of production locations and trajectories based on results of the first and second appraisal wells. The first appraisal location and trajectory are determined a priori while at least the first sequence of production locations and trajectories and the second sequence of production locations and trajectories are selected 1104 later from a plurality of development scenarios determined a priori. For example, the first sequence of production locations and trajectories are selected based on comparing a first measurement on the first appraisal well to a first plurality of intervals of a potential value of a parameter. The second appraisal location and trajectory also may be selected based on comparing a first measurement on the first appraisal well to a first plurality of intervals of a potential value of a parameter. The second sequence of production locations and trajectories may be selected based on comparing a first measurement on the first appraisal well to a first plurality of intervals of a potential value of a parameter and based on comparing a second measurement on the second appraisal well to a second plurality of intervals of the potential value of the parameter. The second plurality of intervals may include more intervals than the first plurality of intervals.

In certain aspects, the plurality of development scenarios may be compiled in a pre-calculated development manual, and the first and further sequences of production locations and trajectories may be selected by comparing appraisal well measurements to intervals of parameter values in the development manual. The development manual may be pre-calculated according to backward induction from optimal performance metrics for each of the development scenarios.

Certain aspects of the inventive method may also include providing a system of distinct software modules, each of the distinct software modules being embodied on a computer-readable storage medium. The distinct software modules may include a technological tree builder module, a development manual production module, and a development manual implementation module. Pre-calculating the development manual may be facilitated by the technological tree builder module and the development manual production module executing on at least one hardware processor. Selecting the first sequence of production locations and trajectories and the further sequences of production locations and trajectories may be facilitated by the development manual implementation module executing on the at least one hardware processor.

Certain aspects of the inventive method may also include receiving, at a technological tree builder module 502, a set 501 of development scenarios, each development scenario comprising a combination of well locations and trajectories corresponding to appraisal wells and production wells; building, in the technological tree builder module 502, a technological tree 400 based on the set of development scenarios; receiving, at a development manual production module, a set 504 of geological realizations; modeling 505, in the development manual production module, performance metrics for each of the development scenarios for each of the set of geological realizations; based on the modeled performance metrics 506, identifying internal nodes of a technological tree 400 in the development manual production module 502; and based on the technological tree, producing a pre-calculated resource field development manual 700 in the development manual production module. Additionally, the method may include receiving 1111, in a development manual implementation module, measurements from an appraisal well; and, by comparing the measurements to the modeled performance metrics at one of the internal nodes, selecting 1104, in the development manual implementation module, a sequence of production wells to be drilled. The internal nodes of the technological tree may be identified by backward induction from optimal performance metrics for each of the development scenarios. For example, the method may include subsets of development scenarios that correspond to intervals of a parameter value.

Other embodiments of the invention provide a computer program product that includes a computer readable storage medium, which embodies computer executable instructions which when executed by a computer cause the computer to facilitate receiving, at a technological tree builder module 502, a set of development scenarios, each development scenario comprising a combination of well locations and trajectories corresponding to appraisal wells and production wells; receiving, at a development manual production module 500, a set of geological realizations; modeling, in the development manual production module 500, performance metrics for each of the development scenarios for each of the set of geological realizations; based on the modeled performance metrics, identifying decisions at internal nodes of a technological tree 400 in the development manual production module 500; and based on the technological tree 400, producing a pre-calculated resource field development manual 700 in the development manual production module. The instructions also may cause the computer to facilitate receiving, in a development manual implementation module 1104, measurements from an appraisal well; and, by choosing a subset of geological models to proceed based on the measurements at the internal nodes "P", selecting, in the development manual implementation module 1104, a sequence of production wells to be drilled. The instructions also may cause the computer to facilitate identifying internal nodes of the technological tree by backward induction from optimal performance metrics for each of the development scenarios. For example, the instructions may cause the computer to facilitate identifying subsets of development scenarios that correspond to intervals of a parameter value.

Other embodiments of the invention provide an apparatus that includes a memory and at least one processor. The processor is operative to facilitate receiving, at a technological tree builder module 502, a set 501 of development scenarios, each development scenario comprising a combination of well locations and trajectories corresponding to appraisal wells and production wells; building, in the technological tree builder module 502, a technological tree 400 based on the set 501 of development scenarios; receiving, at a development manual production module 500, a set of geological realizations 504; modeling, in the development manual production module, performance metrics for each of the development scenarios for each of the set of geological realizations; based on the modeled performance metrics, identifying decisions at internal nodes 403, 404 of the technological tree 400 in the development manual production module; and based on the technological tree 400, producing a pre-calculated resource field development manual 700 in the development manual production module 500. The processor may be further operative to facilitate receiving, in a development manual implementation module 1104, measurements from an appraisal well; and by choosing a subset of geological models to proceed based on the measurements at one of the internal nodes, selecting, in the development manual implementation module, a sequence of production wells to be drilled. Additionally, the processor may be operative to facilitate populating the decision tables in internal nodes of the technological tree by backward induction from optimal performance metrics for each of the development scenarios. Moreover, the processor may be operative to facilitate identifying subsets of development scenarios that correspond to intervals of a parameter value.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 12:
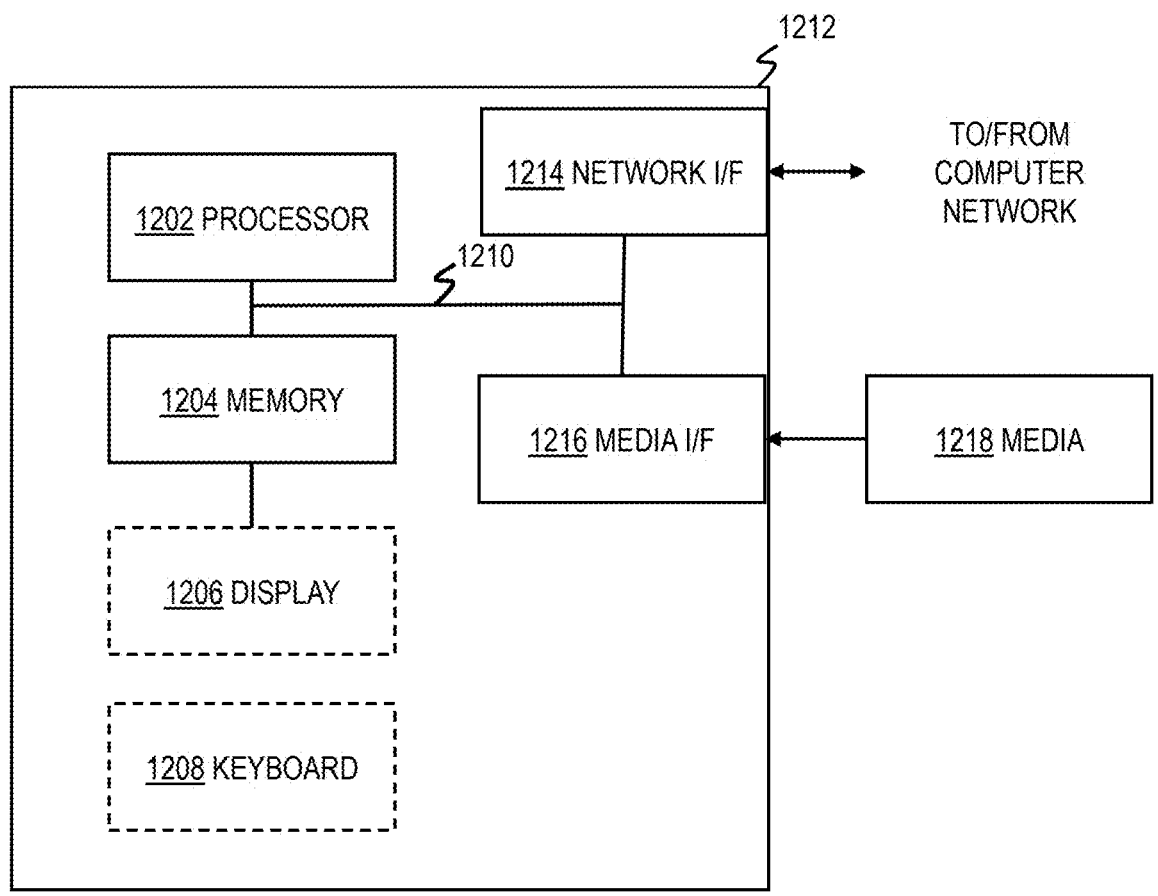
FIG. 12 depicts a computer system configurable to implement embodiments of the invention.

One or more embodiments can make use of software running on a general purpose computer or workstation. With reference to FIG. 12, such an implementation might employ, for example, a processor 1202, a memory 1204, and an input/output interface formed, for example, by a display 1206 and a keyboard 1208. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1202, memory 1204, and input/output interface such as display 1206 and keyboard 1208 can be interconnected, for example, via bus 1210 as part of a data processing unit 1212. Suitable interconnections, for example via bus 1210, can also be provided to a network interface 1214, such as a network card, which can be provided to interface with a computer network, and to a media interface 1216, such as a diskette or CD-ROM drive, which can be provided to interface with media 1218.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1202 coupled directly or indirectly to memory elements 1204 through a system bus 1210. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1208, displays 1206, pointing devices, and the like) can be coupled to the system either directly (such as via bus 1210) or through intervening I/O controllers (omitted for clarity).

Network adapters such as network interface 1214 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 1212 as shown in FIG. 12) running a server program. It will be understood that such a physical server may or may not include a di splay and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 1218 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described.

One example of user interface that could be employed in some cases is hypertext markup language (HTML) code served out by a server or the like, to a browser of a computing device of a user. The HTML is parsed by the browser on the user's computing device to create a graphical user interface (GUI).

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, a technological tree builder module, a development manual production module, and a development manual implementation module. The method steps can then be carried out using the distinct software modules and/or sub-modules of the system, as described above, executing on one or more hardware processors 1202. For example, the technological tree builder module 502 facilitates the steps 602-613 of building the technological tree 400. The development manual production module 500 facilitates the steps 501-508 of producing the development manual 700 from the technological tree 400. The development manual implementation module 1100 facilitates the steps 1101-1112 of implementing the development manual 700 on a reservoir 1107. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

Exemplary System and Article of Manufacture Details

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for developing a resource field, comprising:
   determining a plurality of development scenarios;
   receiving, at a technological tree builder module, the plurality of development scenarios, each development scenario comprising a combination of well locations and trajectories corresponding to appraisal wells and production wells;
   building, in the technological tree builder module, a technological tree based on the plurality of development scenarios;
   receiving, at a development manual production module, a set of geological realizations;
   modeling, in the development manual production module, performance metrics for each of the development scenarios for each of the set of geological realizations;
   based on the modeled performance metrics, identifying decisions at internal nodes of a technological tree in the development manual production module;
   based on the technological tree, producing a pre-calculated resource field development manual in the development manual production module;
   drilling at least a first well at a first location and trajectory that are common to the plurality of development scenarios;
   assessing a result of the at least one first well; and
   drilling a first sequence of subsequent wells at a first sequence of subsequent locations and trajectories that are common to a first subset of development scenarios, consistent with the pre-calculated resource field development manual, wherein the first subset includes at least one development scenario that is selected from the plurality of development scenarios based at least on the result of the first well, wherein the first sequence of subsequent wells includes at least one well.

2. The method of claim 1 further comprising:
   assessing a result of the first sequence of subsequent wells; and
   upon an unacceptable result of the first sequence of subsequent wells, ceasing drilling; or upon any acceptable result of the first sequence of subsequent wells, drilling a second sequence of subsequent wells at a second sequence of subsequent locations and trajectories that are common to a second subset of the plurality of development scenarios, wherein the second subset includes at least one development scenario that is selected from the first subset based at least on the result of the first sequence of subsequent wells, wherein the second sequence of subsequent wells includes at least one well.

3. The method of claim 2 wherein the second sequence of subsequent locations and trajectories are selected based on comparing a measurement on the first sequence of subsequent wells to a plurality of intervals of a potential value of a parameter.

4. The method of claim 2 wherein the second sequence of subsequent locations and trajectories are selected based on comparing a first measurement on the first well to a first plurality of intervals of a potential value of a parameter and based on comparing a second measurement on the first sequence of subsequent wells to a second plurality of intervals of the potential value of the parameter, wherein the second plurality of intervals includes more intervals than the first plurality of intervals.

5. The method of claim 1 wherein the first sequence of subsequent locations and trajectories are selected based on comparing a measurement on the first well to a plurality of intervals of a potential value of a parameter.

6. The method of claim 1 wherein the plurality of development scenarios are compiled in a pre-calculated development manual, and the first subset of development scenarios are selected by comparing at least one result of the first well to intervals of at least one parameter in the development manual.

7. The method of claim 6 wherein the development manual is pre-calculated according to backward induction based on optimal performance metrics for each of the plurality of development scenarios.

8. The method of claim 6, further comprising providing a system, wherein the system comprises distinct software modules, each of the distinct software modules being embodied on a computer-readable storage medium, and wherein the distinct software modules comprise a technological tree builder module, a development manual production module, and a development manual implementation module;
wherein:
pre-calculating the development manual is facilitated by said technological tree builder module and said development manual production module executing on at least one hardware processor; and
selecting the first subset of development scenarios is facilitated by said development manual implementation module executing on said at least one hardware processor.

9. The method of claim 1 further comprising:
receiving, in a development manual implementation module, the result of the at least one first well;
choosing at one of the internal nodes a subset of geological models to proceed with based on the result of the at least one first well; and
selecting, in the development manual implementation module based on the subset of geological models, the first sequence of subsequent wells to be drilled.

10. The method of claim 1 wherein populating internal nodes of the technological tree is accomplished from optimal performance metrics for each of the development scenarios.

11. The method of claim 10 further comprising populating a first plurality of internal nodes corresponding to appraisal well measurements and populating a second plurality of internal nodes corresponding to production well measurements.

12. A computer program product comprising a non-transitory computer readable storage medium embodying computer executable instructions which when executed by a computer cause the computer to facilitate the method of:
receiving, at a technological tree builder module, a set of development scenarios, each development scenario comprising a combination of well locations and trajectories corresponding to appraisal wells and production wells;
building, in the technological tree builder module, a technological tree based on the set of development scenarios;
receiving, at a development manual production module, a set of geological realizations;
modeling, in the development manual production module, performance metrics for each of the development scenarios for each of the set of geological realizations;
based on the modeled performance metrics, identifying internal nodes of a technological tree in the development manual production module;
based on the technological tree, producing a pre-calculated resource field development manual in the development manual production module;
controlling drilling machinery to drill at least a first well at a first location and trajectory that are common to the set of development scenarios;
assessing a result of the at least one first well; and
controlling the drilling machinery to drill a first sequence of subsequent wells at a first sequence of subsequent locations and trajectories that are common to a first subset of development scenarios, consistent with the pre-calculated resource field development manual, wherein the first subset includes at least one development scenario that is selected from the set of development scenarios based at least on the result of the first well, wherein the first sequence of subsequent wells includes at least one well.

13. The product of claim 12 further comprising computer executable instructions which when executed by a computer cause the computer to facilitate:
receiving, in a development manual implementation module, at least one result from the at least one first well; and
choosing at one of the internal nodes a subset of geological models to proceed with based on the at least one result; and
selecting, in the development manual implementation module based on the subset of geological models, a first sequence of subsequent wells to be drilled.

14. The product of claim 12 further comprising computer executable instructions which when executed by a computer cause the computer to facilitate identifying internal nodes of the technological tree from optimal performance metrics for each of the development scenarios.

15. The product of claim 14 further comprising computer executable instructions which when executed by a computer cause the computer to populate a first plurality of internal nodes corresponding to appraisal well measurements and to populate a second plurality of internal nodes corresponding to production well measurements.

16. An apparatus comprising:
a memory; and
at least one processor operative to facilitate:
receiving, at a technological tree builder module, a set of development scenarios, each development scenario comprising a combination of well locations and trajectories corresponding to appraisal wells and production wells;
building, in the technological tree builder module, a technological tree based on the set of development scenarios;
receiving, at a development manual production module, a set of geological realizations;
modeling, in the development manual production module, performance metrics for each of the development scenarios for each of the set of geological realizations;
based on the modeled performance metrics, identifying decisions at internal nodes of the technological tree in the development manual production module;

based on the technological tree, producing a pre-calculated resource field development manual in the development manual production module;

controlling drilling machinery to drill at least a first well at a first location and trajectory that are common to the set of development scenarios;

assessing a result of the at least one first well; and controlling the drilling machinery to drill a first sequence of subsequent wells at a first sequence of subsequent locations and trajectories that are common to a first subset of development scenarios, consistent with the pre-calculated resource field development manual, wherein the first subset includes at least one development scenario that is selected from the set of development scenarios based at least on the result of the first well, wherein the first sequence of subsequent wells includes at least one well.

17. The apparatus of claim 16 wherein the processor is further operative to facilitate:

receiving, in a development manual implementation module, at least one result from the at least one first well; and choosing at one of the internal nodes a subset of geological models to proceed with based on the at least one result; and selecting, in the development manual implementation module based on the subset of geological models, a first sequence of subsequent wells to be drilled.

18. The apparatus of claim 16 wherein the processor is further operative to facilitate identifying internal nodes of the technological tree from optimal performance metrics for each of the development scenarios.

19. The apparatus of claim 18 wherein the processor is further operative to facilitate populating a first plurality of internal nodes corresponding to appraisal well measurements and populating a second plurality of internal nodes corresponding to production well measurements.

* * * * *